(12) United States Patent
Bradley

(10) Patent No.: US 7,872,467 B2
(45) Date of Patent: Jan. 18, 2011

(54) MINIATURE RF CALIBRATOR UTILIZING MULTIPLE POWER LEVELS

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 12/707,899

(22) Filed: Feb. 18, 2010

(65) Prior Publication Data

US 2010/0141238 A1 Jun. 10, 2010

Related U.S. Application Data

(62) Division of application No. 11/856,325, filed on Sep. 17, 2007, now Pat. No. 7,683,602.

(51) Int. Cl.
*G01R 23/165* (2006.01)

(52) U.S. Cl. ................ 324/76.29; 324/555; 324/601

(58) Field of Classification Search ................. 324/555, 324/74, 601, 76.29, 76.39
See application file for complete search history.

(56) References Cited

U.S. PATENT DOCUMENTS 5,262,957 A * 11/1993 Hearn ........................ 702/76

* cited by examiner

*Primary Examiner*—Vincent Q Nguyen
(74) *Attorney, Agent, or Firm*—Fliesler Meyer LLP

(57) ABSTRACT

A small light-weight battery operated calibrator device provides a precise sine wave output for use in calibration of test equipment, such as a RF Power Meter or a Spectrum Analyzer. The calibration device includes two power levels, one −40 dBm and one 0 dBm. The purpose of the two power levels is to obtain a slope and offset for correction of the RF power measuring device being calibrated. Operation indication LED lights are provided to indicate which of the two powers are in use, and if battery power is below acceptable levels. Miniature low power components including a crystal oscillator and a divide by 2 integrated circuit that generates a precise square wave and a low pass filter for converting the square wave into a precise sine wave allows the calibrator to be battery operated and stored as a calibration component.

7 Claims, 3 Drawing Sheets

MINIATURE RF CALIBRATOR UTILIZING MULTIPLE POWER LEVELS

CLAIM FOR PRIORITY

This application is a divisional of application Ser. No. 11/856,325 filed on Sep. 17, 2007, now U.S. Pat. No. 7,683,602 entitled "Miniature RF Calibrator Utilizing Multiple Power Levels," by Donald Anthony Bradley, the entire contents of which are incorporated herein by reference.

BACKGROUND

1. Technical Field

The present invention relates to components used in the calibration or verification of absolute frequency and amplitude measuring test equipment. More particularly the present invention relates to a highly accurate sine wave generation circuit used in calibrating or verifying the accuracy of test equipment such as RF power meters and spectrum analyzers.

2. Related Art

Existing calibration devices that can generate precise sine waves are typically provided internal to the instrument being calibrated, or as an external attachment. The internal RF calibrator in a test device typically has one power level and is accessible using the front panel space on the instrument. It may be undesirable, however, to use the front panel space which is typically in short supply on portable instrumentation. An external bench top calibrator, further, is typically bulky and requires a wall plug in line voltage for operation. The required line voltage may not be available for a field test instrument.

FIG. 1 shows a block diagram of components of a typical calibrator. The system includes a precise oscillator 2, typically operating at 50 MHz. The output of oscillator 2 is provided to a level modulator 4 that provides a stable voltage output from the oscillator 2 as controlled by a feedback signal. The output of the level modulator 4 passes through an amplifier 6, low pass filter 8, and attenuator 22 to a test port 24. The attenuator 22 is shown as a variable attenuator, allowing a user to set the desired attenuation level. The amplifier 6 increases the output of oscillator 2, while low pass filter 8 removes unwanted harmonics. The variable attenuator 22 is typically included in an external bench top calibrator that connects to a test device, allowing a user to select different output levels as desired during calibration. As an alternative to the variable attenuator 22, a fixed attenuator can be used. A fixed attenuator is more typically included on a calibrator that is internal to a test device.

The feedback signal to the level modulator 4 is provided from an amplifier 16. The feedback signal comes to an input of amplifier 16 from the output of the low pass filter 8 through a detector diode 10 and resistor 14. A filter capacitor 12 removes an AC component of the feedback signal. A capacitor 20 enables amplifier 16 to function as an integrator. A second input to the amplifier 16 is provided from a voltage reference 18. The voltage reference 18 has a voltage value set to control the desired input level of attenuator 22.

It would be desirable to provide components for a calibration device that can provide a precise sine wave with two power levels that does not use up front panel space on an instrument being calibrated, is not bulky, and does not require a line voltage attachment.

SUMMARY

According to embodiments of the present invention, a calibrator is provided that can generate precise sine waves and not suffer the drawbacks of prior art devices.

The calibrator is a battery operated and provides two very precise sine wave outputs for use in calibration of amplitude or frequency measuring test equipment. With battery power, a line voltage is not required during testing. The calibrator further uses small light weight components, so it can be easily transported and used in a field test area, and will not use front panel space of an instrument being calibrated.

The calibration device includes two power switches connecting the battery to a voltage regulator, one with attenuation of –40 dBm and one without at 0 dBm to provide two calibrated RF power levels. The purpose of the two power levels is to obtain a slope and offset for correction of the RF sensor in a test device being calibrated.

The switches selecting either –40 dB or 0 dB of attenuation drive the voltage regulator that powers a crystal oscillator. The oscillator then drives a divide by two flip flop that generates a highly symmetrical square wave that has its amplitude controlled by the precision temperature corrected DC voltage regulator and its frequency stabilized by the quartz temperature corrected oscillator. The output of the divide by two frequency divider is then directed through a voltage divider to a low pass filter. With the –40 dB switch, the output of the divide by two frequency divider is connected to the low pass filter through a 10K resistor providing a 100:1 reduction. With the 0 dBm switch, the output of the divide by two frequency divider is provided to the filter through an AND gate that has a 10 Ohm resistance in series with a 90 Ohm resistor to form a total 100 Ohm resistor. An additional 100 Ohm resistor forms a two to one voltage divider with this first 100 Ohm combination to provide a two to one voltage division with a 50 Ohm output impedance to the low pass filter. With either the –40 dB or 0 dB switches, the voltage divider provides a precise square wave to the low pass filter with a matched source impedance of 50 Ohms.

The low pass filter then removes all of the harmonics of the square wave to provide a precise sine wave output. The low pass filter output is provided through an attenuator and blocking capacitor to an output terminal of the calibrator. Diode protection devices are provided to divert static discharge or high power input surges applied to the output connector. The overall combination of components can be built from light weight low power components that still provide the precise sine wave output. Miniature low power components allow the calibrator to be battery operated and stored as a calibration component after use.

In some embodiments, operation indication LED lights are provided to indicate the operation state of the calibrator. A green LED is connected with circuitry to provide two intensities depending on whether the –40 dBm or the 0 dBm attenuator is in use. A blinking red light is further connected with circuitry to indicate if battery power is below acceptable levels.

BRIEF DESCRIPTION OF THE DRAWINGS

Further details of the present invention are explained with the help of the attached drawings in which.

DETAILED DESCRIPTION

Figure 1:
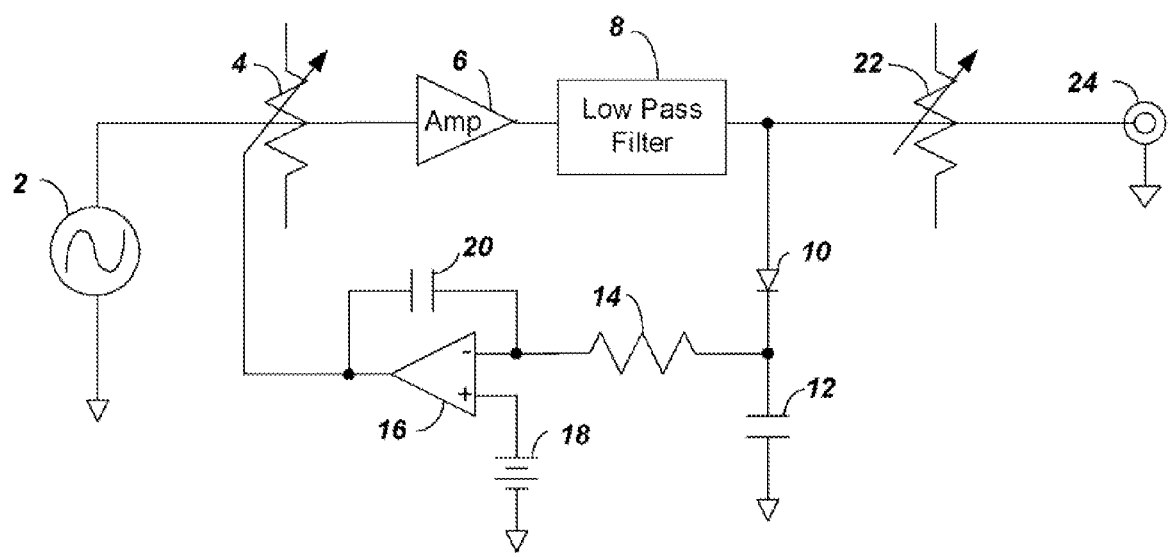
FIG. 1 shows a block diagram of components of a conventional calibrator.
Figure 2:
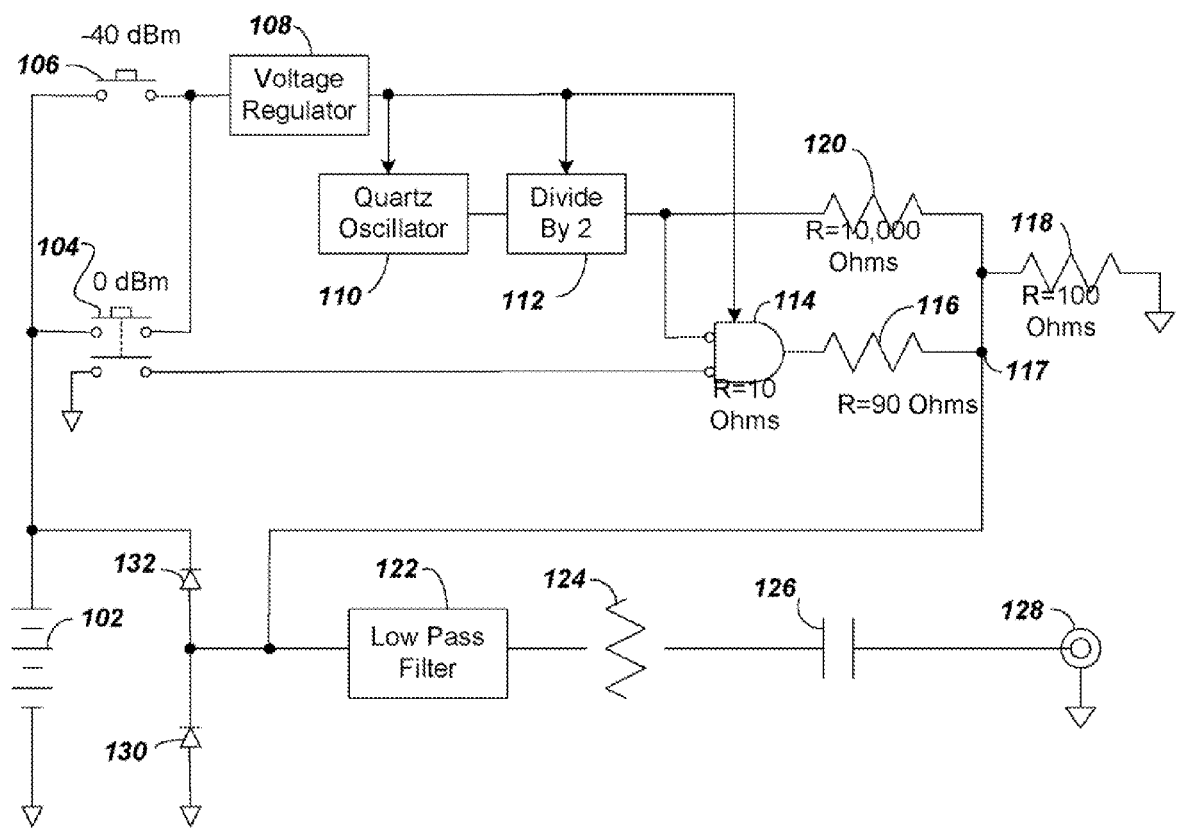
FIG. 2 shows a block diagram of a miniature RF calibrator according to embodiments of the present invention.

FIG. 2 shows a block diagram of a miniature RF calibrator according to embodiments of the present invention. The RF calibrator includes a battery 102 connected to two switches 104 and 106. The switch 104 provides an attenuation factor of 1 or 0 dBm, while the switch 6 provides an attenuation factor of 100 or −40 dBm. The purpose of the two power levels is to obtain a slope and offset for correction of the RF sensor in a test device being calibrated.

The output of the switches 104 and 106 are connected to a voltage regulator 8. The output of the voltage regulator 8 provides power driving a quartz oscillator 10, a divide by two flip flop 12, and a two input AND gate. The oscillator 10 provides a highly accurate frequency at twice the output frequency to the divide by two flip flop 12. The square wave output has its amplitude controlled by the precision temperature corrected DC voltage regulator 108 and its frequency controlled by the quartz temperature corrected oscillator 110. An exemplary voltage regulator 108 that provides for such temperature correction is the Analog Devices ADP3336. An exemplary quartz temperature corrected oscillator 110 is the Kyocera K30-3C0-100.0000.

The symmetry of the square wave is controlled by a divide by 2 frequency divider 112. The frequency divider 112 can be constructed with complementary CMOS transistors. An exemplary frequency divider 112 is the Fairchild NC7SZ74. A slight resistance change of the output transistors in the frequency divider 112 over temperature is compensated for by the temperature dependant voltage regulator 108 to yield a constant output square wave voltage under a fixed resistive load. Output symmetry is inherent due to the frequency divider 112 changing states on only the positive going edge of the quartz oscillator.

The output of the frequency divider 112 has a low 10 Ohm impedance. The 10 Ohm frequency divider 112 matches an impedance of the AND gate 114 which appears as a 10 Ohm resistor. The AND gate 114 can be constructed using complementary CMOS transistors similar to the frequency divider 112. The AND gate 114 will provide a 10 Ohm resistance for both the 0 and 1 produced output. An exemplary circuit for the AND gate that provides a 10 Ohm resistance is the Fairchild NC7SZ02. Although an AND gate 114 is shown and described, other logic providing a Boolean AND can be used.

With switch 104 used the output of the AND gate 114 is enabled. The output of the 10 Ohm AND gate 114 is then provided through a 90 Ohm resistor 116. The total resistance of the series AND gate 114 and the 90 Ohm resistor is then 100 Ohms. This 100 Ohm total resistance is connected to a node 117 to another 100 Ohm resistance 118 that connects to ground. This forms a 50 Ohm output impedance voltage divider to drive the low pass filter 122.

During use of switch 106, the output of AND gate 114 is disabled. The disabled AND gate 114 provides a 10 Ohm resistance to ground. With switch 104 disabled, the output of the frequency divider 112 is provided through a 10,000 Ohm resistor 120 to node 117 to connect to the low pass filter 122. The attenuation factor of the voltage divider formed by the 10 Ohm AND gate 114 in series with the 90 Ohm resistor 116 and the 10,000 Ohm resistor 120 presents a 100:1 reduction of the precision square wave available to the low pass filter 122 compared with the signal available when switch 104 is enabled.

With either switch 104 or 106 used, the precision square wave from node 117 now enters the low pass filter 122. Filter 122 removes all harmonics of the fundamental frequency. The filter 122 is designed to present a 50 Ohm output impedance at the desired output frequency. It is also designed to accept slight variations on its input impedance without affecting its output impedance. This can be accomplished at a single frequency of interest. With switch 106 enabled, the filter 122 output frequency is now a pure sine wave with an amplitude of −36.5 dBm. The filter 122 is followed by a fixed 3.5 dB attenuator 124. The final output at terminal 128 is, then, a −40.0 dBm pure sine wave. A source match is tightly controlled to provide the greater than 40 dB return loss and a SWR<1.02 by precision design of the attenuator 124 and low pass filter 122. Although specific attenuation values for the switches 104 and 106, resistance values of resistors 116, 117, 118 and 120, AND gate 114, and attenuation of attenuator 124 are given, these exemplary values may be changed depending on desired design requirements.

A DC blocking capacitor 126 follows the attenuator 124. The DC blocking capacitor 126 is used to reference the output to 0 volts DC. The blocking capacitor 126 is further used to block any unintended DC from being applied to the calibrator output. Back to back diodes 130 and 132 at the input to filter 122 also prevent unintended RF energy as well as static discharge from destroying CMOS device components. The CMOS components that could be damaged include those in the AND gate 114 or the frequency divider 112. A first diode 130 in the back to back diodes connects node 117 at the input of filter 122 to ground, while the diode 132 connects node 117 to the battery 102. Neither diode conducts current during normal operation.

Operation of the calibrator of FIG. 2 is described as follows. Depressing the −40 dBm push button enables power to the circuit and disables AND gate 114. The quartz oscillator 110 produces a very stable frequency at 2 times the output frequency. This signal has no amplitude control or duty cycle control, but is suitable to drive the divide by 2 divider 112. The output of divider 112 has a low 10 Ohm impedance. The slight resistance change of the output transistors in the divider 112 over temperature is compensated for by the temperature dependant voltage regulator 108 to yield a constant output square wave voltage into a fixed resistive load. Output symmetry is inherent due to the frequency divider 112 changing states on only the positive edge of the quartz oscillator 110.

With AND gate 114 disabled when using switch 106, the square wave is then presented to the approximately 10,000 Ohm resistor 120 and the disabled AND gate 114 and 90 Ohm resistor 116. Disabled AND gate 114 appears as a 10 Ohm resistor to ground. The attenuation factor of this voltage divider represents a 100:1 reduction of the precision square wave available at the output of divider 117 compared with the signal available when switch 104 is enabled. The precision square wave now enters low pass filter 122 which filters all harmonics of the fundamental frequency. The filter 122 presents a 50 Ohm output impedance at the desired output frequency. Filter 122 also accepts slight variations on its input impedance without affecting its output impedance. This can be accomplished at a single frequency of interest.

With switch 106 enabled, the output of filter 122 is now a pure sine wave with an amplitude of −36.5 dBm. The filter 122 is followed by a fixed 3.5 dB attenuator 124 and has DC blocked by capacitor 126. The final output is a −40.0 dBm pure sine wave. The blocking capacitor 126 references the output to 0 VDC. It also blocks any unintended DC from being applied to the calibrator output. Back to back diodes 130 and 132 at the input to filter 122 prevent unintended RF energy as well as static discharge from destroying its CMOS components.

Depressing the 0 dBm switch 104 enables the AND gate 114. The output of the AND gate 114 is a precision square wave switching between ground and the regulated voltage. It has a 10 Ohm output resistance, which in series with the approximately 90 Ohm resistor 116 appears at 100 Ohms. The slight resistance change of the output transistors in the AND gate 114 over temperature is compensated for by the temperature dependant voltage regulator to yield a constant output square wave voltage into a fixed resistive load. This 100 Ohms is provided in series with the 100 Ohm resistor 118 to ground and creates a divide by two voltage divider at node 117. The Thevinin equivalent impedance of the input of filter 122 then appears as a fixed 50 Ohms for both 0 and −40 dBm selections, and further operation of the calibrator is similar to that described with the −40 dBm switch depressed.

Figure 3:
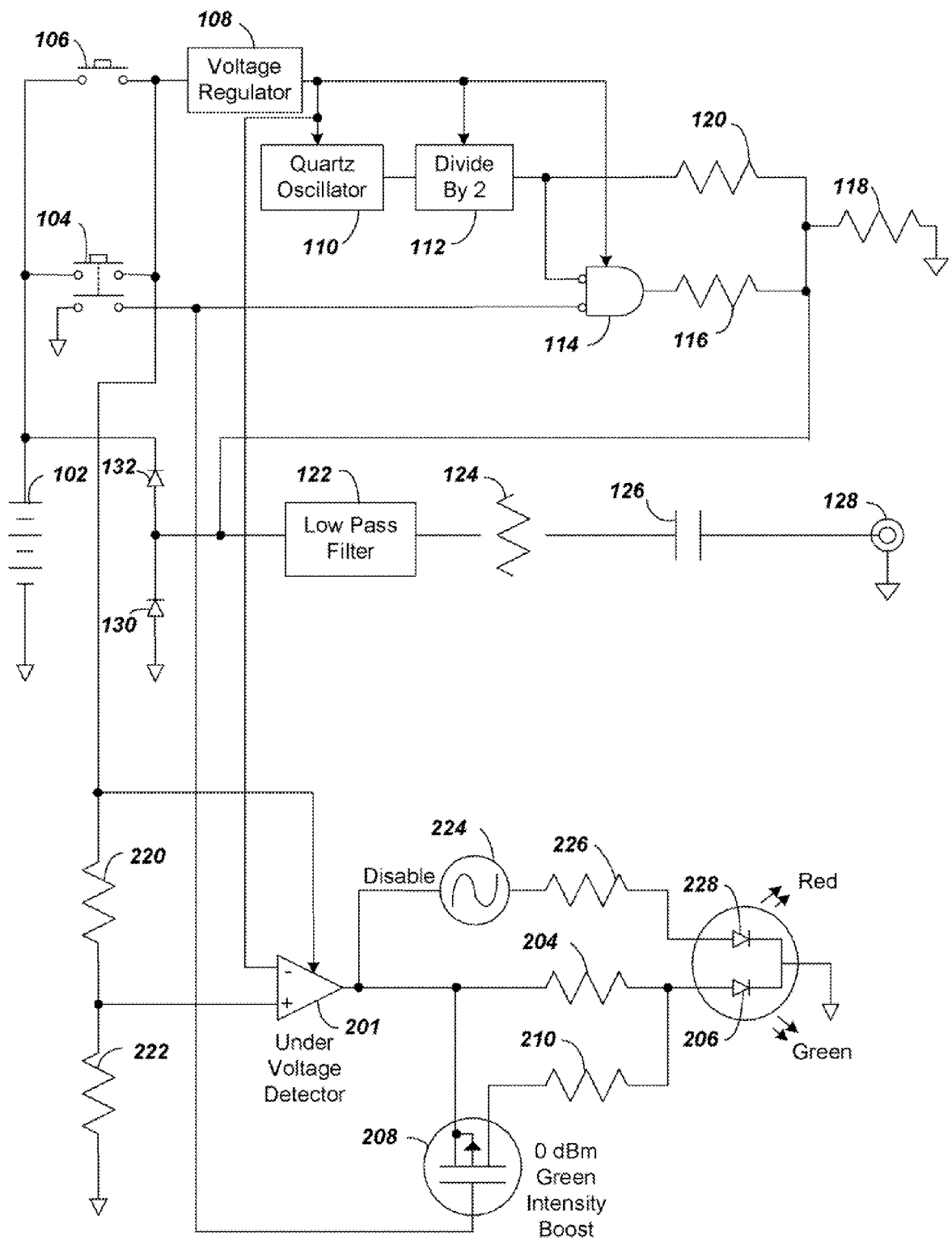
FIG. 3 shows components providing LED lights connected to give a user a visual indication of the state of operation of the calibrator of FIG. 1.

FIG. 3 shows components providing dual colored LED lights 206 and 228 connected to give a user a visual indication of the state of operation of the calibrator of FIG. 2. Depressing the −40 dBm switch button 106 causes the green LED 206 to illuminate at a visible brightness. Depressing the 0 dBm switch button 104 causes the green LED 206 to illuminate twice as bright. Battery voltage below a usable range needed to keep the regulator 108 in regulation causes the red LED to flash 228, indicating a low battery condition for battery 102. In one embodiment, the LED lights 206 and 228 can be provided by a single red/green LED. An example of such a red/green LED is the Lumex SSL-LX30591 GW.

The state indication circuit includes a comparator amplifier 201 having a first input connected to the output of voltage regulator 108, and a second input connected through a voltage divider formed by resistors 220 and 222 to the input of voltage regulator 108. Power is supplied to the comparator 201 from the input to the voltage regulator. The output of comparator 201 drives a resistor 204 that connects to the green LED 206. An exemplary circuit for the comparator is the National Semiconductors LMV7239. Under normal conditions the comparator 201 provides an output of logic one or the voltage of battery 102. To increase the intensity of the green LED 206 when switch 104 is depressed, a PMOS FET transistor 208 is provided with a gate connected to the ground connection of the switch 104. An exemplary PMOS FET transistor 208 is the Zetex ZXM61P02F. With the switch 104 depressed, the source-drain path of transistor 208 connects the output of comparator 201 through a resistor 210 to the green LED 206, thus reducing the overall resistance from the output of comparator 201 and LED 206 and increasing intensity of LED 206. With switch 104 open, the transistor 208 will remain off and the intensity of LED 206 will be reduced when switch 106 is connected.

An oscillator 224 is connected by a resistor 226 to the red LED 228. The input of the oscillator 224 receives a disable signal from the output of comparator 201. Thus, when the oscillator 124 is not receiving a disable signal from comparator 201, it will enable the oscillator 224 and the red LED 228 will blink on and off at the oscillator 224 frequency of approximately 10 Hertz. For convenience, components in FIG. 3 that are carried over from FIG. 2 are similarly labeled.

Operation of the circuitry of FIG. 3 used in driving the green LED 206 is described as follows. First, selection of the −40 dBm switch 106 and sufficient voltage from battery 102 for proper operation will illuminate the green LED 206 at moderate brightness. The selection of 0 dBm switch 104 and sufficient battery voltage enables the boost transistor 208 that applies approximately twice the current to the green LED 206 so that it provides twice the illumination.

Operation of the circuitry used in driving the red LED 228 is described as follows. First, the voltage regulator 108 provides a reference voltage used to compare to the voltage of the battery 102. If the voltage of battery 102 drops below approximately 0.2V above the voltage of regulator 108 output the comparator 201 will change state from a 1 to a 0. This will enable the 10 Hz flashing oscillator which drives the red LED 228. The green LED 206 will be disabled.

Although specific voltages for battery 102, oscillation frequencies for the LEDs, and LED colors are described, these are exemplary and may be changed based on design requirements.

Although the present invention has been described above with particularity, this was merely to teach one of ordinary skill in the art how to make and use the invention. Many additional modifications will fall within the scope of the invention, as that scope is defined by the following claims.

What is claimed:

1. A calibration device for providing a test signal to calibrate an RF Power Meter or a Spectrum Analyzer, the calibration device comprising:
    a battery power connection;
    a temperature compensating voltage regulator having an input and an output;
    a first switch for connecting the battery connection to a voltage regulator;
    a second switch for connecting the battery connector to the voltage regulator, the second switch providing a different attenuation than the first switch from the battery connection to the voltage regulator;
    an oscillator having a power supply input connected to the output of the voltage regulator and an output, the oscillator providing a first signal at its output;
    a frequency divider having an input connected to the output of the oscillator and having an output, the frequency divider having a power supply input connected to the output of the voltage divider;
    a logic gate providing an AND operation, the logic gate having a first input connected to the output of the oscillator, a second input connected by the second switch to a ground connection, and an output, the logic gate having a power supply input connected to the output of the voltage divider;
    a low pass filter for converting the first signal from the oscillator to the test signal for providing to an output of the low pass filter;
    a first resistor for connecting the output of the frequency divider to the low pass filter;
    a second resistor for connecting the output of the logic gate to the low pass filter;
    a third resistor connecting the low pass filter to ground;
    an attenuator having an input connected to the output of the low pass filter and providing an output; and
    a DC blocking capacitor connecting the output of the attenuator to the output of the calibration device.

2. The calibration device of claim 1, further comprising a state indication device comprising:
    a first LED connected to the output of the voltage regulator to provide a first lighting condition when the first switch is connected to the battery supply connection and a second lighting condition when the second switch is connected to the battery supply connection.

3. The calibration device of claim 2, wherein the state indication device further comprises:

an comparator having a first input connected to the output of the voltage regulator, a second input, and an output, and having a power supply input connected to the input of the voltage regulator;
a voltage divider connecting the input of the voltage regulator to the second input of the comparator;
a first LED resistor connecting the output of the comparator to an input of the first LED;
a second LED resistor having a first terminal connected to the input of the first LED and having a second terminal; and
a transistor having a gate connected to the second input of the logic gate, and a source-drain path connecting the output of the comparator to the second input of the second LED resistor.

4. The calibration device of claim 3, further comprising:
a second LED having a second light, the second LED flashing on and off when a voltage at the battery supply connection drops below a desired level.

5. The calibration device of claim 4, wherein the state indication device further comprises:
an oscillator having an enable signal input connected to the output of the comparator, and an output; and
a third LED resistor connecting the output of the oscillator to the second LED.

6. The calibration device of claim 3, further comprising:
a second LED providing a lighting condition indicating when the battery supply connection drops below a desired level.

7. The calibration device of claim 6,
wherein the first LED and the second LED have different colors,
wherein the different lighting conditions of the first LED comprises different intensities, and
wherein the lighting condition of the second LED indicating a low battery supply comprises flashing of the LED.

* * * * *